(12) United States Patent
Loh

(10) Patent No.: US 8,755,237 B2
(45) Date of Patent: Jun. 17, 2014

(54) SRAM POWER REDUCTION THROUGH SELECTIVE PROGRAMMING

(75) Inventor: Wah Kit Loh, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 191 days.

(21) Appl. No.: 13/359,827

(22) Filed: Jan. 27, 2012

(65) Prior Publication Data

US 2013/0094314 A1    Apr. 18, 2013

Related U.S. Application Data

(60) Provisional application No. 61/547,145, filed on Oct. 14, 2011.

(51) Int. Cl.
G11C 7/00    (2006.01)

(52) U.S. Cl.
USPC ............... 365/200; 365/189.05; 365/225.7

(58) Field of Classification Search
USPC .................. 365/200, 189.05, 225.7
See application file for complete search history.

(56) References Cited

U.S. PATENT DOCUMENTS

| | | | |
|---|---|---|---|
| 6,195,300 B1 * | 2/2001 | Kirihata et al. | 365/200 |
| 6,560,139 B2 | 5/2003 | Ma et al. | |
| 6,947,346 B2 * | 9/2005 | Shore et al. | 365/222 |
| 7,272,061 B2 * | 9/2007 | Saleh | 365/203 |

* cited by examiner

Primary Examiner — Son Dinh
Assistant Examiner — Nam Nguyen
(74) Attorney, Agent, or Firm — Rose Alyssa Keagy; Wade J. Brady, III; Frederick J. Telecky, Jr.

(57) ABSTRACT

A method of programming a memory array having plural subarrays is disclosed. (FIG. 3). The method includes determining a minimum operating voltage (Vmin) for each subarray of the plural subarrays (306). A first voltage is applied to each subarray having a minimum operating voltage greater than a predetermined voltage (420, 422, 424). A second voltage is applied to each subarray having a minimum operating voltage less than the predetermined voltage (308 and 426, 428).

20 Claims, 5 Drawing Sheets

SRAM POWER REDUCTION THROUGH SELECTIVE PROGRAMMING

CLAIM TO PRIORITY OF NONPROVISIONAL APPLICATION

This application claims the benefit under 35 U.S.C. §119 (e) of Provisional Appl. No. 61/547,145 (TI-69006PS), filed Oct. 14, 2011, which is incorporated herein by reference in its entirety.

BACKGROUND OF THE INVENTION

Embodiments of the present invention relate to a static random access memory (SRAM) and particularly to power reduction in a standby mode of operation.

Shrinking semiconductor integrated circuit feature sizes have placed increasing challenges on semiconductor integrated circuit processing. In particular, a balance between high packing density and yield requires a finely tuned manufacturing process. Minimum feature sizes of high density memory cells are frequently less than corresponding feature sizes of peripheral circuits. These minimum feature sizes often result in undesirable current leakage in the memory cell during both active and standby modes of operation. Ma et al. (U.S. Pat. No. 6,560,139) disclose such an undesirable leakage path. Referring to FIG. 1, there is a six transistor (6T) SRAM cell of the prior art as disclosed by Ma et al. The 6T cell includes a first inverter formed by p-channel transistor P1 and n-channel transistor N1. The first inverter is cross-coupled with a second inverter formed by p-channel transistor P2 and n-channel transistor N2. Access transistors 100 and 102 couple the memory cell to bit line (BL) and complementary bit line (/BL), respectively, when the word line (WL) is high. When the word line is low, there are two primary sub-threshold leakage paths 104 and 106 in the memory cell for the illustrated data state. Leakage path 104 is through access transistor 100 to the "0" state terminal of the memory cell. Leakage path 106 is from the "1" state terminal of the memory cell through n-channel transistor N2. Ma et al. disclose the subthreshold drain current is an exponential function of Vgs-Vt, where Vgs is the gate-to-source voltage and Vt is the threshold voltage of the respective n-channel transistor. Ma et al. further disclose that the magnitude of read current when the word line is high is essentially the saturation current of n-channel transistor 100, and that this saturation current is proportional to a square of the difference between Vcc and Vt. Therefore, the read current declines faster than the leakage current as the supply voltage (Vcc) is lowered. (col. 2, lines 35-49). Ma et al. have recognized these problems and have used both small 301A and large 303A bias transistors for memory cells of an array having a high word line and only a small bias transistor 301B for memory cells of the array having a low word line. (FIG. 3, col. 3, lines 41-55). Ma et al., however, have not addressed problems that arise with multiple subarrays and for active and standby modes of operation.

BRIEF SUMMARY OF THE INVENTION

In a preferred embodiment of the present invention, a method of programming a memory array having plural subarrays is disclosed. The method comprises determining a minimum operating voltage for each of the plural subarrays. A first voltage is applied to each subarray having a minimum operating voltage greater than a predetermined voltage. A second voltage is applied to each subarray having a minimum operating voltage less than the predetermined voltage.

DETAILED DESCRIPTION OF THE INVENTION

The preferred embodiments of the present invention provide significant advantages in reduced power consumption over static random access memory (SRAM) arrays of the prior art in both active and standby modes of operation.

Figure 1:
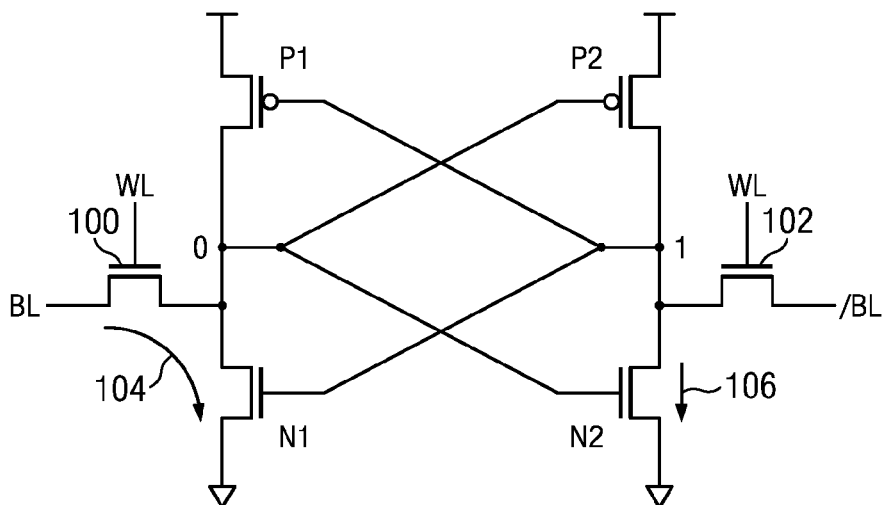
FIG. 1 is a schematic diagram of a six-transistor (6T) static random access memory (SRAM) cell of the prior art.
Figure 2:
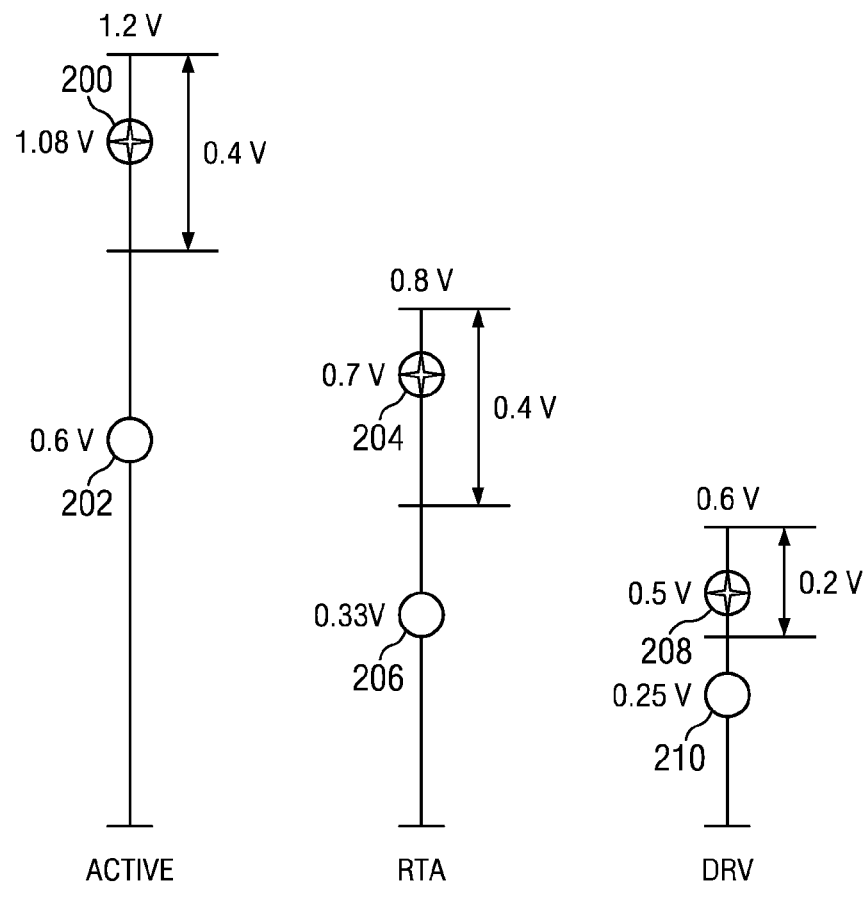
FIG. 2 is a diagram of voltage levels that may be applied to an SRAM during active and standby modes of operation.
Figure 4A:
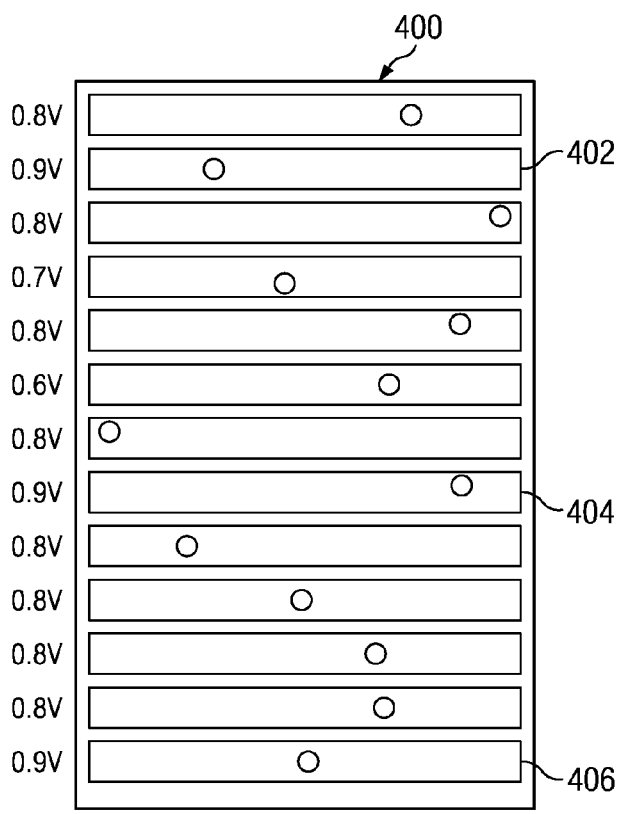
FIG. 4A is a block diagram of an SRAM memory array having 16 subarrays and illustrating the maximum Vmin of each subarray.

Referring now to FIG. 2, there is an exemplary voltage diagram showing voltage ranges for an active mode, a retain until access (RTA) mode, and a data retention voltage (DRV) mode of operation. The RTA and DRV modes are standby modes of operation that may be used for high performance and high density memories, respectively. The high performance memory preferably has somewhat larger feature sizes and lower latency than the high density memory. Correspondingly, the high density memory may have somewhat lower access time than the high performance memory and, therefore, be more tolerant of longer latency. Both memories are preferably designed as arrays of contiguous subarrays. By way of example, FIG. 4A illustrates such a memory array 400 having 16 contiguous subarrays.

Figure 3:
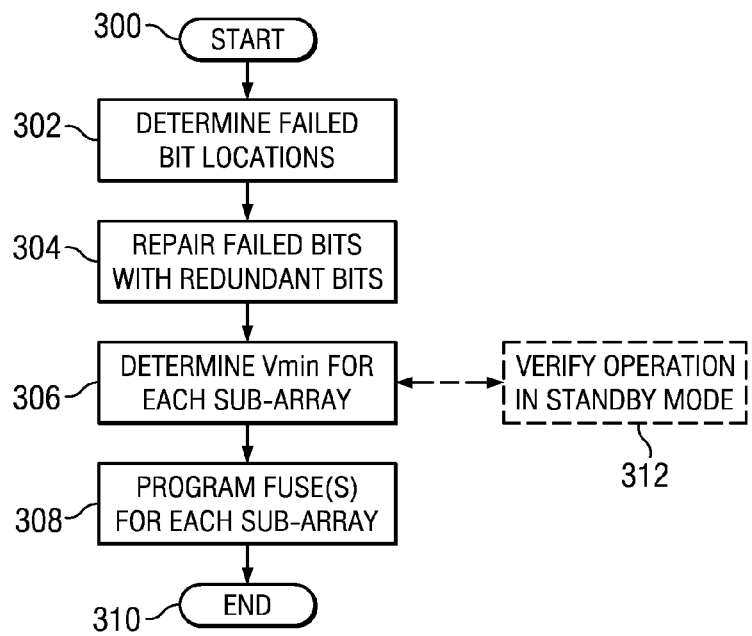
FIG. 3 is a flow chart showing an exemplary test mode of an SRAM according to the present invention.

Turning now to FIG. 3, there is a flow chart illustrating a representative test procedure according to the present invention. In the following discussion, bits and memory cells are often used interchangeably and have the same meaning. The test procedure begins at step 300. Failed bit locations are first determined at step 302. These failed bits are then repaired with redundant bits at step 304. Of course, steps 302 and 304 are optional, since many memory arrays will have no failed bits. Next, at step 306 a minimum operating voltage (Vmin) is determined for each subarray. The minimum operating voltage (Vmin) is the minimum supply voltage at which all memory cells in the subarray still meet a required access time. As will become apparent in the following discussion, Vmin of bits in a subarray are typically distributed over a range of voltages. Moreover, Vmin for a subarray may be determined by a single bit in the subarray. For example, the active mode voltage diagram of FIG. 2 shows bit 200 has a maximum Vmin of 1.08 V. By way of comparison, bit 202 of another subarray has a maximum Vmin of 0.6 V. At the completion of step 306 (FIG. 3), each subarray of FIG. 4A is assigned a respective Vmin. In particular, subarrays 402, 404, and 406 are each characterized by a Vmin of 0.9 V. Other subarrays within memory array 400 are characterized by respective Vmin values from 0.6 V to 0.8 V. The bits that determine Vmin are shown as small circles in each subarray with their respective Vmin values to the left. A predetermined voltage is selected corresponding to a voltage drop element (VDE) as will be described in detail. In the active voltage diagram of FIG. 2, the predetermined voltage is 0.4 V.

Figure 4B:
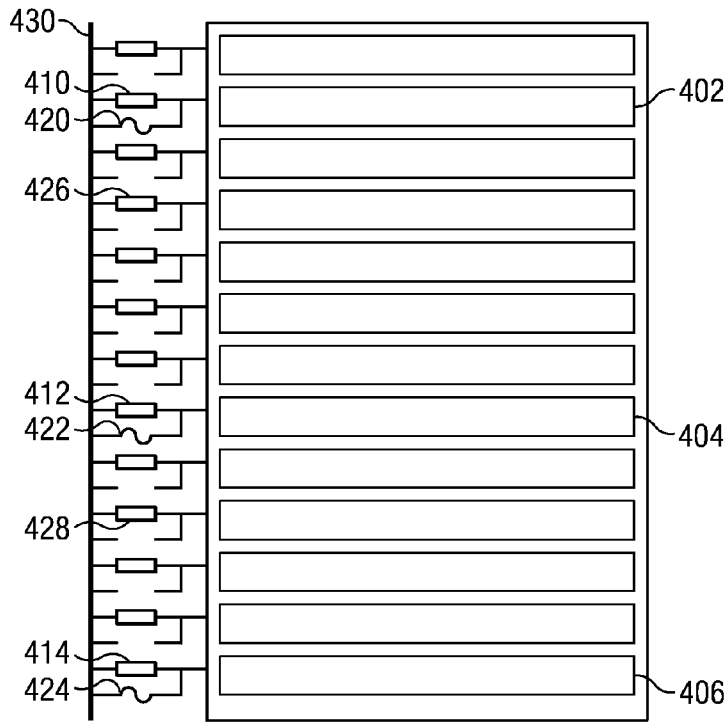
FIG. 4B is a schematic diagram of the SRAM memory array of FIG. 4A showing fuse programming for each subarray to select appropriate voltage drop elements (VDE)

At step 308, fuses are programmed to selectively exclude or include respective VDEs of each subarray as shown at FIG. 4B. These fuses may be electrically programmable efuses, laser programmable fuses, nonvolatile storage elements such as EEPROM cells, or other programmable elements as are well known in the art. Fuses 420, 422, and 424 are left intact and serve as shunts for respective voltage drop elements 410, 412, and 414. Thus, an array supply voltage applied to lead 430 is substantially the subarray supply voltage for subarrays 402, 404, and 406. Conversely, fuses for other subarrays are blown or programmed so that these subarrays receive a supply voltage equal to the voltage at lead 430 less the predetermined voltage of their respective voltage drop elements such as 426 and 428. This is illustrated at the active diagram of FIG. 2. Thus, subarrays 402, 404, and 406 operate in active mode at a 1.2 V supply voltage. All other subarrays operate in active mode at a 0.8 V supply voltage of 1.2 V less the predetermined voltage of 0.4 V. This advantageously reduces active power consumption of the memory array by operating 13 of the 16 subarrays at a reduced supply voltage. Furthermore, operating efficiency of the memory array is not compromised, since each of the 16 subarrays still meets the desired Vmin specification.

The programming step is normally concluded at step 310. At step 312, operation of each subarray is verified in standby mode. Step 312 is optional, since it is not an essential step of the present invention. Typically, Vmin of each subarray maintains similar characteristics in standby mode to those of active mode. Referring to the RTA voltage diagram of FIG. 2, for example, bit 204 has a Vmin in standby mode of 0.7 V. This may be the same bit (200) that had a Vmin of 1.08 V in active mode. Likewise, bit 206 has a Vmin in standby mode of 0.33 V. This may be the same bit (202) that had a Vmin of 0.6 V in active mode. Thus, the operating voltage for subarrays 402, 404, and 406 in RTA mode is 0.8 V. The predetermined voltage of 0.4 V in the RTA mode voltage diagram shows that the operating voltage for all other subarrays is 0.4 V or 0.8 V less the predetermined voltage of 0.4 V. This is not strictly true in practical application, since the voltage drop element may produce both a diode drop and a current-voltage drop between the supply voltage terminal and the selected subarrays. Since the current in standby mode is typically less than the current in active mode, the predetermined voltage will often be slightly less in standby mode than in active mode for the same VDE. However, the previously described advantages of the present invention in active mode carry over to the RTA standby mode of operation. RTA standby power consumption of the memory array is reduced by operating 13 of the 16 subarrays at a reduced supply voltage of 0.4 V. Furthermore, operating efficiency of the memory array is not compromised, since each of the 16 subarrays still meets the desired Vmin specification.

Turning now to the DRV voltage diagram of FIG. 2, there are representative voltages of another standby mode of operation that may be used for high density memories where slower access and longer latency are acceptable. Here, an array supply voltage of 0.6 V is applied to lead 430 (FIG. 4B). This is substantially the subarray supply voltage for subarrays 402, 404, and 406. Conversely, fuses for other subarrays are blown or programmed so that these other subarrays receive a supply voltage equal to the voltage at lead 430 less the predetermined voltage of their respective voltage drop elements such as 426 and 428. This is illustrated at the DRV diagram of FIG. 2. Thus, subarrays 402, 404, and 406 operate in DRV mode at a 0.6 V supply voltage. This is exemplified by bit 208, having a Vmin of 0.5 V. All other subarrays operate in DRV mode at a 0.4 V or a supply voltage of 0.6 V less the predetermined voltage of 0.2 V. This is exemplified by bit 210, having a Vmin of 0.25 V. This advantageously reduces DRV standby power consumption of the memory array by operating 13 of the 16 subarrays at a reduced supply voltage. Furthermore, operating efficiency of the memory array is not compromised, since each of the 16 subarrays still meets the desired Vmin specification.

Figure 5A:
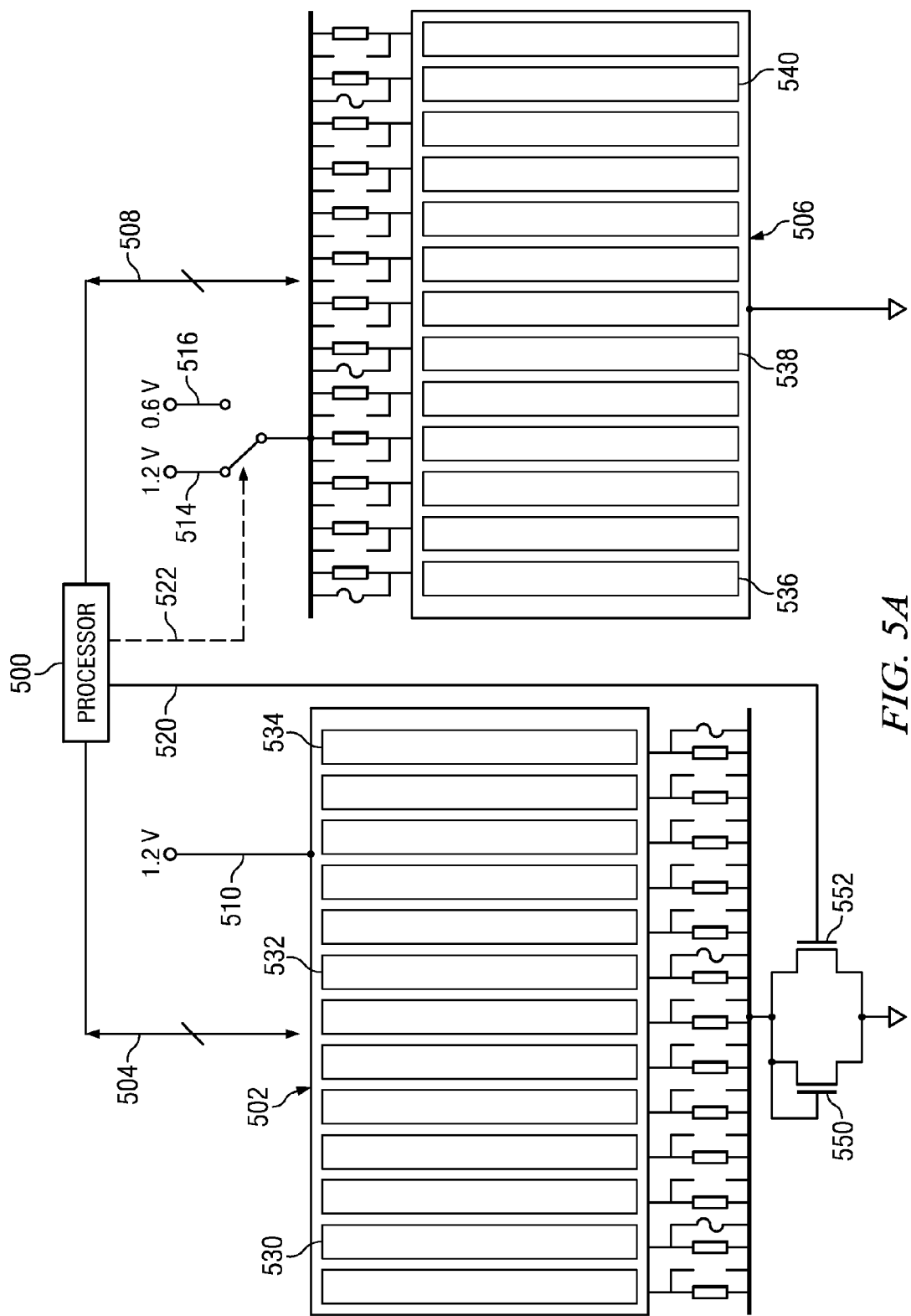
FIG. 5A is a schematic diagram of a first embodiment of a system level domain including an SRAM of the present invention having first and second memory arrays.

Turning now to FIG. 5A, there is a schematic diagram of a first embodiment of a system level domain including an SRAM of the present invention having first and second memory arrays. Here, the first memory array 502 is a high performance memory array, and the second memory array 506 is a high density memory array. The system level domain includes processor 500, which may include multiple processors as well as a memory controller. Processor 500 communicates with SRAM array 502 via bus 504, which includes address, control, and data leads. SRAM array 502 includes subarrays 530-534, which have their fuses intact to shunt their respective voltage drop elements. Other subarrays of array 502 have their fuses blown or programmed so that their respective voltage drop elements reduce the voltage applied to these other subarrays as previously discussed. In an active mode of operation, processor 500 applies a high level signal to n-channel transistor 552 via lead 520. This turns on n-channel transistor 552 so that subarrays 530-534 operate at the 1.2 V supply voltage applied to lead 510. Other subarrays of array 502, however, operate at 1.2 V less the voltage across their respective voltage drop elements or approximately 0.8 V. In RTA standby mode of operation, processor 500 applies a low level signal to n-channel transistor 552 via lead 520. This turns off n-channel transistor 552 so that subarrays 530-534 operate at the 0.8 V or 1.2 V less the voltage drop across n-channel transistor 550. Other subarrays of array 502 operate at 0.8 V less the voltage across their respective voltage drop elements or approximately 0.4 V. This is highly advantageous in reducing power consumption in array 502 in both active and standby modes of operation.

Processor 500 also communicates with SRAM array 506 via bus 508, which includes address, control, and data leads. SRAM array 506 includes subarrays 536-540, which have their fuses intact to shunt their respective voltage drop elements. Other subarrays of array 506 have their fuses blown or programmed so that their respective voltage drop elements reduce the voltage applied to these other subarrays as previously discussed. In an active mode of operation, processor 500 switches the supply voltage to 1.2 V on lead 514 via a signal on lead 522. Here, and in the following discussion the switch may be a p-channel transistor or other switching device. Therefore, subarrays 536-540 operate at the 1.2 V supply voltage applied to lead 514. Other subarrays of array 506, however, operate at 1.2 V less the voltage across their respective voltage drop elements or approximately 1.0 V. In the DRV standby mode of operation, processor 500 switches the supply voltage to 0.6 V on lead 516. In this mode, subarrays 536-540 operate at the 0.6 V. Other subarrays of array 506 operate at 0.6 V less the voltage across their respective voltage drop elements or approximately 0.4 V. As with array 502, this is highly advantageous in reducing power consumption in array 506 in both active and standby modes of operation.

Figure 5B:
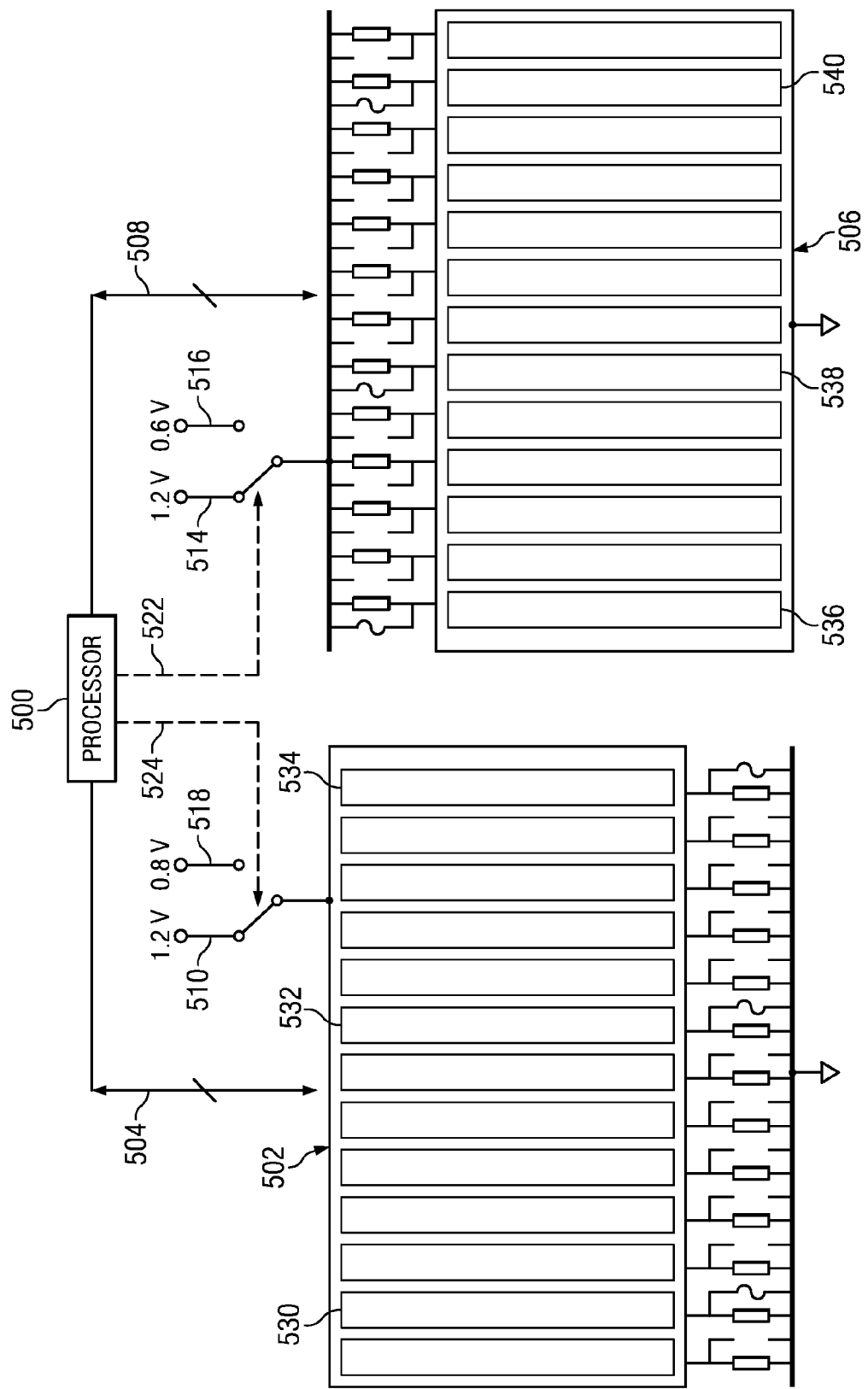
FIG. 5B is a schematic diagram of a second embodiment of a system level domain including an SRAM of the present invention having first and second memory arrays.

Referring now to FIG. 5B, there is a schematic diagram of a second embodiment of a system level domain including an SRAM of the present invention having first 502 and second 506 memory arrays. Here, however, processor 500 switches memory array 502 to the 1.2 V supply voltage on lead 510 in an active mode in response to a signal on lead 524. As previously discussed, subarrays 530-534 have their fuses intact to shunt their respective voltage drop elements and operate at 1.2 V. Other subarrays of array 502 have their fuses blown or programmed so that their respective voltage drop elements reduce the voltage applied to these other subarrays to approximately 0.8 V or 1.2 V less the predetermined voltage of 0.4 V. In RTA standby mode of operation, processor 500 switches memory array 502 to the 0.8 V supply voltage on lead 518 in response to the signal on lead 524. Thus, subarrays 530-534 operate at the 0.8 V. Other subarrays of array 502 operate at 0.8 V less the voltage across their respective voltage drop elements or approximately 0.4 V. This is highly advantageous in reducing power consumption in array 502 in both active and standby modes of operation.

Figure 6A:
FIGS. 6A through 6D are schematic diagrams of various voltage drop elements (VDE) that may be used with the SRAM arrays of FIGS. 4B, 5A, 5B, 7B, or 7C.
Figure 6B:
Figure 6C:
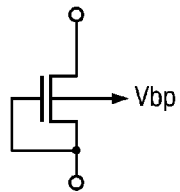
Figure 6D:
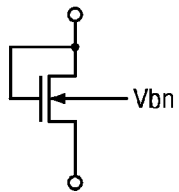

Turning now to FIGS. 6A through 6D there are several exemplary voltage drop elements that may be used in various combinations with the present invention. FIG. 6A is a simple resistor that may be formed from polycrystalline silicon or P+ or N+ implanted regions of a silicon substrate. FIG. 6B may be a PN diode having a 0.7 V drop or a Schottky diode having a 0.25 V drop. FIG. 6C is an n-channel transistor connected in diode configuration. A voltage Vbp may be applied to the bulk terminal to slightly adjust the threshold voltage due to body effect. FIG. 6D is a p-channel transistor connected in diode configuration. A voltage Vbn may be applied to the bulk terminal to slightly adjust the threshold voltage due to body effect.

Figure 7A:
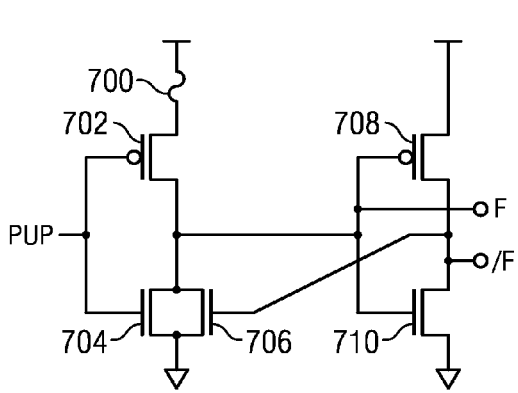
FIG. 7A is a schematic diagram of a fuse latch of the present invention.

In previously discussed embodiments of the present invention, each voltage drop element was selected or deselected by blowing or programming a fuse connected in parallel with the voltage drop element. Alternatively, it may be desirable to include a fuse latch as illustrated in FIG. 7A. The fuse latch of FIG. 7A is either programmed by blowing (programming) fuse 700 or fuse 700 is left intact. At power up of the memory array, a short duration positive pulse PUP is applied to the control gates of p-channel transistor 702 and n-channel transistor 704. The high level of PUP temporarily drives the output signal on lead F low. If fuse 700 is intact, a subsequent low level of PUP returns output signal on lead F high. The high output signal on lead F is applied to the control gates of p-channel transistor 708 and n-channel transistor 710. This produces a low level complementary output signal on output lead /F. The low level output signal on lead /F is applied to the control gate of n-channel transistor 706 so that it remains off. Alternatively, if fuse 700 is blown, the high level of PUP temporarily drives the output signal on lead F low. The low output signal on lead F is applied to the control gates of p-channel transistor 708 and n-channel transistor 710. This produces a high level complementary output signal on output lead /F. The high level output signal on lead /F is applied to the control gate of n-channel transistor 706 so that it remains on to latch the state of the blown fuse 700. A subsequent low level of PUP, therefore, does not affect the latched output signals on leads F and /F.

Figure 7B:
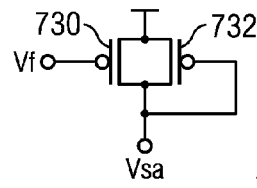
FIGS. 7B and 7C are schematic diagrams of selective voltage drop element (VDE) circuits that may be used with the fuse latch of FIG. 7A.

Referring now to FIG. 7B, there is a schematic diagram of a selective voltage drop element (VDE) circuit that may be used with the fuse latch of FIG. 7A. The VDE circuit includes p-channel transistor 732 connected as a diode between an array supply voltage terminal and a respective subarray voltage terminal (Vsa). The current path of p-channel transistor 730 is connected in parallel with p-channel transistor 732. The control gate of p-channel transistor 730 is coupled to receive signal Vf, which may be the output signal from lead F or the complementary output signal from lead /F (FIG. 7A). Thus, a high level of signal Vf turns off p-channel transistor 730 so that the VDE 732 reduces the supply voltage applied to the respective subarray. Alternatively, a low level of signal Vf turns on p-channel transistor 730 to shunt the VDE so that the full array supply voltage is applied to the respective subarray.

Figure 7C:
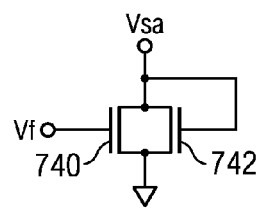

FIG. 7C is a schematic diagram of another selective voltage drop element (VDE) circuit that may be used with the fuse latch of FIG. 7. The VDE circuit includes n-channel transistor 742 connected as a diode between an array reference voltage terminal and a respective subarray voltage terminal (Vsa). The current path of n-channel transistor 740 is connected in parallel with n-channel transistor 742. The control gate of n-channel transistor 740 is coupled to receive signal Vf, which may be the output signal from lead. F or the complementary output signal from lead /F (FIG. 7A). Thus, a low level of signal Vf turns off n-channel transistor 740 so that the VDE 742 reduces the supply voltage applied to the respective subarray. Alternatively, a high level of signal Vf turns on n-channel transistor 740 to shunt the VDE so that the full array supply voltage is applied to the respective subarray.

The embodiments of FIGS. 7A through 7C are highly advantageous for several reasons. First the low level of PUP prevents current flow through fuse 700 in the event a high resistance path remains after programming. Second, the current requirement of each subarray is not limited by the fuse. Rather, the current capacity is determined by device sizes of the circuits of FIGS. 7B and 7C. Finally, circuits 7B and 7C may be driven by either the output signal on lead F or the complementary output signal on lead /F. Thus, the connection may be selected to minimize the number of fuses that must be programmed.

Still further, while numerous examples have thus been provided, one skilled in the art should recognize that various modifications, substitutions, or alterations may be made to the described embodiments while still falling within the inventive scope as defined by the following claims. For example, the circuits of FIGS. 7B and 7C include VDEs 732 and 742, respectively. However, these might be connected to between alternative supply voltage terminals and the subarray voltage terminal (Vsa) rather than in diode configurations. Complementary output signals from the fuse latch of FIG. 7A would then apply either the full array supply voltage or a reduced array supply voltage to subarray supply voltage terminal Vsa. Numerous design alternatives, test methods, and test voltages are possible for alternative memory designs and various processes. Other combinations will be readily apparent to one of ordinary skill in the art having access to the instant specification.

What is claimed is:
1. An integrated circuit, comprising:
 a memory array having a plurality of memory subarrays;
 a control circuit arranged to apply a first supply voltage to
  a first subarray of the memory array in an active mode of
  operation, and the control circuit arranged to apply a second supply voltage to the first subarray of the memory array and a third supply voltage to a second subarray of the memory array in a standby mode of operation.

2. An integrated circuit as in claim 1, comprising a processor circuit coupled to the memory array.

3. An integrated circuit as in claim 2, wherein the processor circuit comprises a memory controller.

4. An integrated circuit as in claim 1, wherein the plurality of subarrays is contiguous.

5. An integrated circuit as in claim 1, wherein the second supply voltage differs from the third voltage by a voltage across a voltage drop element (VDE).

6. An integrated circuit as in claim 5, wherein the voltage drop element is programmable by a fuse.

7. An integrated circuit as in claim 5, wherein voltage drop element is coupled between the second subarray and a reference supply terminal.

8. An integrated circuit as in claim 5, wherein voltage drop element is coupled between the second subarray and a voltage supply terminal.

9. A method of programming a memory array having plural subarrays, comprising:
   determining a maximum value of a minimum operating voltage for each subarray of the plural subarrays;
   applying a first supply voltage to each subarray having the maximum value greater than a predetermined voltage; and
   applying a second supply voltage to each subarray having the maximum value less than the predetermined voltage.

10. A method as in claim 9, wherein the steps of applying are performed in an active mode of operation.

11. A method as in claim 9, wherein the steps of applying are performed in a standby mode of operation.

12. A method as in claim 9, wherein the predetermined voltage comprises a supply voltage less a voltage across a voltage drop element (VDE).

13. A method as in claim 9, comprising:
    determining failed bits in the plural subarrays prior to the step of determining the maximum value; and
    repairing the failed bits with redundant bits prior to the step of determining the maximum value.

14. A memory system, comprising:
    a processor circuit;
    a memory array coupled to the processor circuit, the memory array having a plurality of memory subarrays;
    a control circuit arranged to apply a first supply voltage to a first subarray of the memory array in an active mode of operation, and
    the control circuit arranged to apply a second supply voltage to the first subarray of the memory array and a third supply voltage to a second subarray of the memory array in a standby mode of operation.

15. A memory system as in claim 14, wherein the processor circuit comprises a memory controller.

16. A memory system as in claim 14, wherein the plurality of subarrays is contiguous.

17. A memory system circuit as in claim 14, wherein the second supply voltage differs from the third voltage by a voltage across a voltage drop element (VDE).

18. A memory system as in claim 17, wherein the voltage drop element is programmable by a fuse.

19. A memory system as in claim 18, wherein the fuse comprises a fuse latch circuit having complementary output terminals.

20. A memory system as in claim 19, wherein the voltage drop element is coupled to one of the complementary output terminals and coupled between the second subarray and one of a voltage supply terminal and a voltage reference terminal.

* * * * *